US006920681B2

(12) United States Patent
Hirose et al.

(10) Patent No.: US 6,920,681 B2
(45) Date of Patent: Jul. 26, 2005

(54) METHOD OF PREPARING AN ELECTROMAGNETIC ACTUATOR USING A SUBSTRATE

(75) Inventors: Futoshi Hirose, Kanagawa-ken (JP); Takayuki Yagi, Kanagawa-ken (JP); Susumu Yasuda, Tokyo (JP); Takahisa Kato, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/669,001

(22) Filed: Sep. 24, 2003

(65) Prior Publication Data

US 2004/0056741 A1 Mar. 25, 2004

Related U.S. Application Data

(62) Division of application No. 09/871,637, filed on Jun. 4, 2001, now Pat. No. 6,674,350.

(30) Foreign Application Priority Data

Jun. 16, 2000 (JP) ....................................... 2000-180907

(51) Int. Cl.[7] ............................ G01R 3/00; H01E 3/00; H01E 7/08

(52) U.S. Cl. .......................... 29/595; 29/596; 29/602.1; 29/603.03; 29/603.07; 29/603.08; 29/603.18; 29/603.23; 335/256

(58) Field of Search ........................ 29/595, 596, 602.1, 29/603.03, 603.07, 603.08, 603.16, 603.18, 603.23; 438/3, 57, 88; 324/97, 96; 430/315, 329, 320; 335/256, 220, 78–80

(56) References Cited

U.S. PATENT DOCUMENTS

| | | | | | |
|---|---|---|---|---|---|
| 3,503,022 | A | | 3/1970 | Burdett | 335/256 |
| 3,619,673 | A | | 11/1971 | Helms | 310/12 |
| 4,421,381 | A | * | 12/1983 | Ueda et al. | 359/214 |
| 4,527,139 | A | | 7/1985 | Bohg et al. | 335/256 |
| 4,752,757 | A | * | 6/1988 | Uetsuhara | 335/230 |
| 4,857,781 | A | | 8/1989 | Shih | 310/12 |
| 5,107,372 | A | | 4/1992 | Gelbart et al. | 359/824 |
| 5,647,311 | A | | 7/1997 | Liang et al. | 123/90.11 |
| 5,724,015 | A | | 3/1998 | Tai et al. | 335/78 |
| 5,966,009 | A | * | 10/1999 | Asada | 324/97 |
| 6,014,240 | A | | 1/2000 | Floyd et al. | 359/201 |
| 6,054,329 | A | * | 4/2000 | Burghartz et al. | 438/3 |
| 6,124,923 | A | * | 9/2000 | Horikawa | 355/53 |

FOREIGN PATENT DOCUMENTS

| | | | | |
|---|---|---|---|---|
| EP | 0 730 241 A2 | | 9/1991 | |
| EP | 0 574 004 A2 | | 6/1993 | |
| GB | 2 156 590 A | | 10/1985 | |
| JP | 57-37752 | | 3/1982 | |
| JP | 59-57881 | | 4/1984 | |
| JP | 07-131136 | * | 10/1993 | H05K/3/20 |
| WO | WO 84/04198 | | 10/1984 | |
| WO | WO 94/11942 | | 5/1994 | |
| WO | WO 00/05734 | | 2/2000 | |

* cited by examiner

*Primary Examiner*—Carl J. Arbes
*Assistant Examiner*—Tai Van Nguyen
(74) *Attorney, Agent, or Firm*—Fitzpatrick, Cella, Harper & Scinto

(57) ABSTRACT

An electromagnetic actuator includes a stationary member, a movable member magnetically coupled with the stationary member with a gap therebetween, and a support member for displaceably supporting the movable member relative to the stationary member. Both the stationary member and the movable member have a core section carrying a coil wound around its periphery. As the coil of the stationary member and that of the movable member are energized with electric current, the movable member is either attracted toward or repulsed from the stationary member. The electromagnetic actuator can be used for an optical scanner by providing a mirror and a lens on the movable member.

1 Claim, 9 Drawing Sheets

METHOD OF PREPARING AN ELECTROMAGNETIC ACTUATOR USING A SUBSTRATE

This application is a division of application Ser. No. 09/871,637 filed Jun. 4, 2001 now U.S. Pat. No. 6,674,350, now allowed.

BACKGROUND OF THE INVENTION

1. Field of the Invention

This invention relates to an electromagnetic actuator, an optical scanner using an electromagnetic actuator and a method of preparing an electromagnetic actuator.

2. Related Background Art

Conventional actuators prepared by utilizing the micro-machining technology are mostly based on the use of electrostatic force or piezoelectric phenomena. However, thanks to the availability of the micro-machining technology for utilizing magnetic materials in recent years, actuators using electromagnetic force have been developed.

FIG. 1 of the accompanying drawings schematically illustrates a linear actuator that utilizes an electromagnetic force for positioning the head of a hard disk as disclosed in U.S. Pat. No. 5,724,015. Referring to FIG. 1, the actuator comprises a pair of cores 1004*a*, 1004*b* rigidly secured to a substrate (not shown) and a pair of coils 1005*a*, 1005*b* wound around the respective cores along with a movable member 1003 so supported by springs 1007 as to be movable relative to the cores 1004*a*, 1004*b*. The above-described structure is formed on the substrate by means of micromachining technology.

As electric power is supplied to the coil 1005*a* of the actuator, the movable member 1003 is pulled toward the core 1004*a* to consequently displace the movable member 1003 to the left in FIG. 1. When, on the other hand, the coil 1005*b* is electrically energized, the movable member 1003 is displaced to the right in FIG. 1. The force $F_1$ generated in the actuator is expressed by formula (1) below;

$$F_1=0.5\mu_0 N_1^2 i_1^2 w_1 t_1 (d_1-x_1)^{-2} \quad (1)$$

where $\mu_0$ is the magnetic permeability of vacuum, $N_1$ is the number of turns of the coils, $i_1$ is the electric current made to flow to the coil 1005*a* or 1005*b*, $w_1$ is the width of the magnetic pole, $t_1$ is the thickness of the magnetic pole and $d_1$ is the length of the gap. If the spring constant of the springs 1007 is $k_1$, the displacement $x_1$of the actuator is expressed by using the relationship of formula (2) below;

$$F_1=k_1 x_1 \quad (2)$$

However, since actuators having a configuration as described above by referring to FIG. 1 show a large leakage of magnetic flux, they are accompanied by the problem of a poor energy efficiency. Additionally, since the number of turns of the coils of such an actuator is limited due to the structure where only the stationary members are provided with coils, the actuator is also accompanied by the problem of a weak generated force.

SUMMARY OF THE INVENTION

In view of the above identified technological problems of the prior art, it is therefore the object of the present invention to provide an electromagnetic actuator that can minimize the leakage of magnetic flux and hence the power consumption rate to improve the energy efficiency and remarkably increase the force it can generate, an optical scanner comprising such an electromagnetic actuator and also a method of preparing such an electromagnetic actuator.

According to the invention, the above-described object is achieved by providing an electromagnetic actuator comprising:

a stationary member having a first core section carrying a first coil wound around its periphery;

a movable member magnetically coupled with the stationary member with a gap therebetween and having a second core section carrying a second coil wound around its periphery;

a support member for displaceably supporting the movable member relative to the stationary member; and an electric current source for displacing the movable member relative to the stationary member by supplying electricity to the first and second coils.

In another aspect of the invention, there is provided an optical scanner comprising an electromagnetic actuator according to the invention and a mirror arranged on the movable member of the electromagnetic actuator.

In another aspect of the invention, there is provided an optical scanner comprising an electromagnetic actuator according to the invention and a lens arranged on the movable member of the electromagnetic actuator.

In still another aspect of the invention, there is also provided a method of preparing an electromagnetic actuator comprising a stationary member having a first core section carrying a first coil wound around its periphery, a movable member magnetically coupled with the stationary member with a gap therebetween and having a second core section carrying a second coil wound around its periphery and a support member for displaceably supporting the movable member relative to said stationary member, the method comprising steps of:

forming the stationary member, the movable member and the support member on a single substrate by means of photolithography and plating; and removing the substrate from under the movable member so as to make the movable member to be supported by the substrate by way of the support member.

DESCRIPTION OF THE PREFERRED EMBODIMENTS

Figure 1:
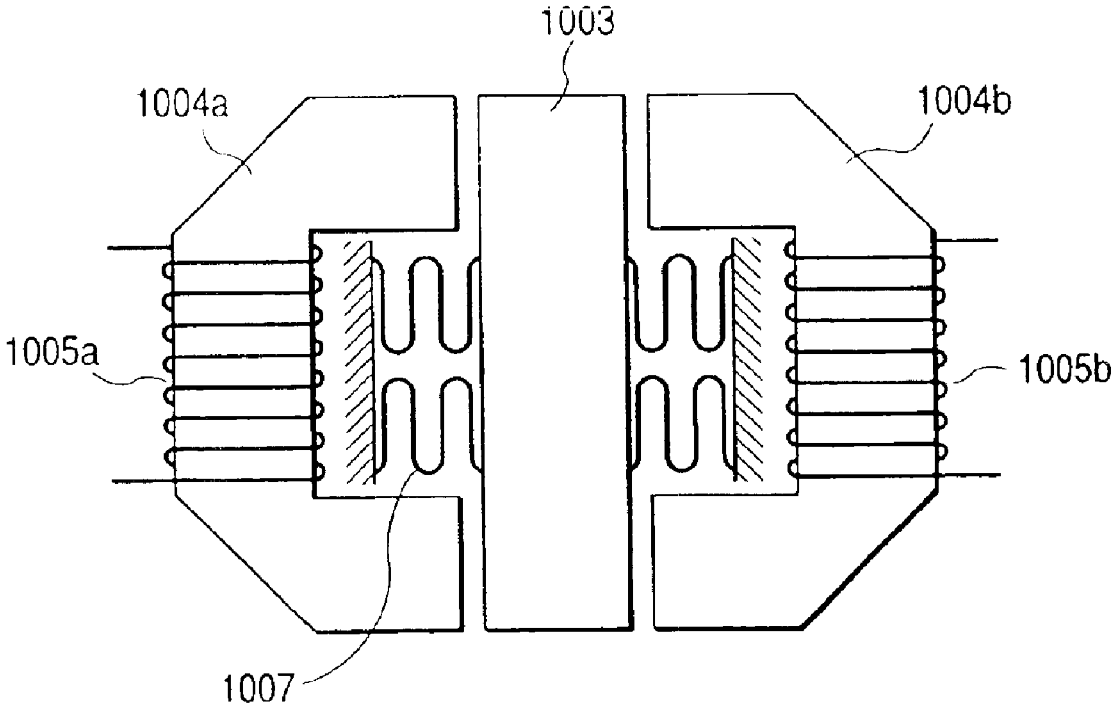
FIG. 1 PRIOR ART
FIG. 1 is a schematic view of a known electromagnetic actuator.

An electromagnetic actuator according to the invention comprises a movable member and a stationary member having respective coils and cores which are magnetically coupled with each other so that a troidal coil is formed by each of the movable member and the stationary member to reduce the leakage of magnetic flux. Therefore, the electromagnetic actuator can minimize the consumption rate of electric current and maximize the energy efficiency. Additionally, both the movable member and the stationary member are provided with respective coils, the total number of turns of the coils can be increased to consequently raise the force that the actuator can generate.

The electric circuit of the above arrangement can be simplified by electrically connecting the stationary coil and the movable coil to consequently simplify the process of preparing the actuator. Additionally, the phenomenon that the force generated in the actuator is inversely proportional to the square of the gap separating the stationary member and the movable member can be eliminated when the stationary member and the movable member are provided with projections and depressions and arranged in such a way that they are combined interdigitally and hence the force generated in the actuator can be determined simply as a function of the electric current flowing through the coils. With such an arrangement, it is possible to control an electromagnetic actuator according to the invention provides by far easier than any conventional electromagnetic actuators.

Still additionally, the stationary member and the movable member of an electromagnetic actuator can be located accurately relative to each other to accurately control the gap separating them by forming both the stationary member and the movable member on a single substrate. It is also possible to simplify the process of preparing an electromagnetic actuator according to the invention by forming the stationary member, the movable electromagnetic and the support member as integral parts thereof. Furthermore, the support member can be made to directly follow the movement of the movable member without friction and play when the support member is formed by using parallel hinged springs. It is also possible to select the rotational direction of the movable coil so that an attraction type electromagnetic actuator or a repulsion type electromagnetic actuator may be prepared freely at will.

It is possible to prepare an optical scanner comprising an electromagnetic actuator according to the invention by micromachining to make the deflector show an excellent energy efficiency and a wide angle of deflection.

Any assembling process can be made unnecessary when the movable member, the stationary member and the support member of an electromagnetic actuator are formed on a substrate by means of photolithography and plating. Then, these components can be aligned highly accurately and the gap separating the movable member and the stationary can be minimized. Additionally, such an electromagnetic actuator is adapted to mass production and cost reduction. If a silicon substrate is used for the substrate, it can be subjected to an anisotropic etching process for accurately forming openings in the substrate.

Now, the present invention will be described in greater detail by referring to the accompanying drawings that illustrate preferred embodiments of the invention.

Figure 2:
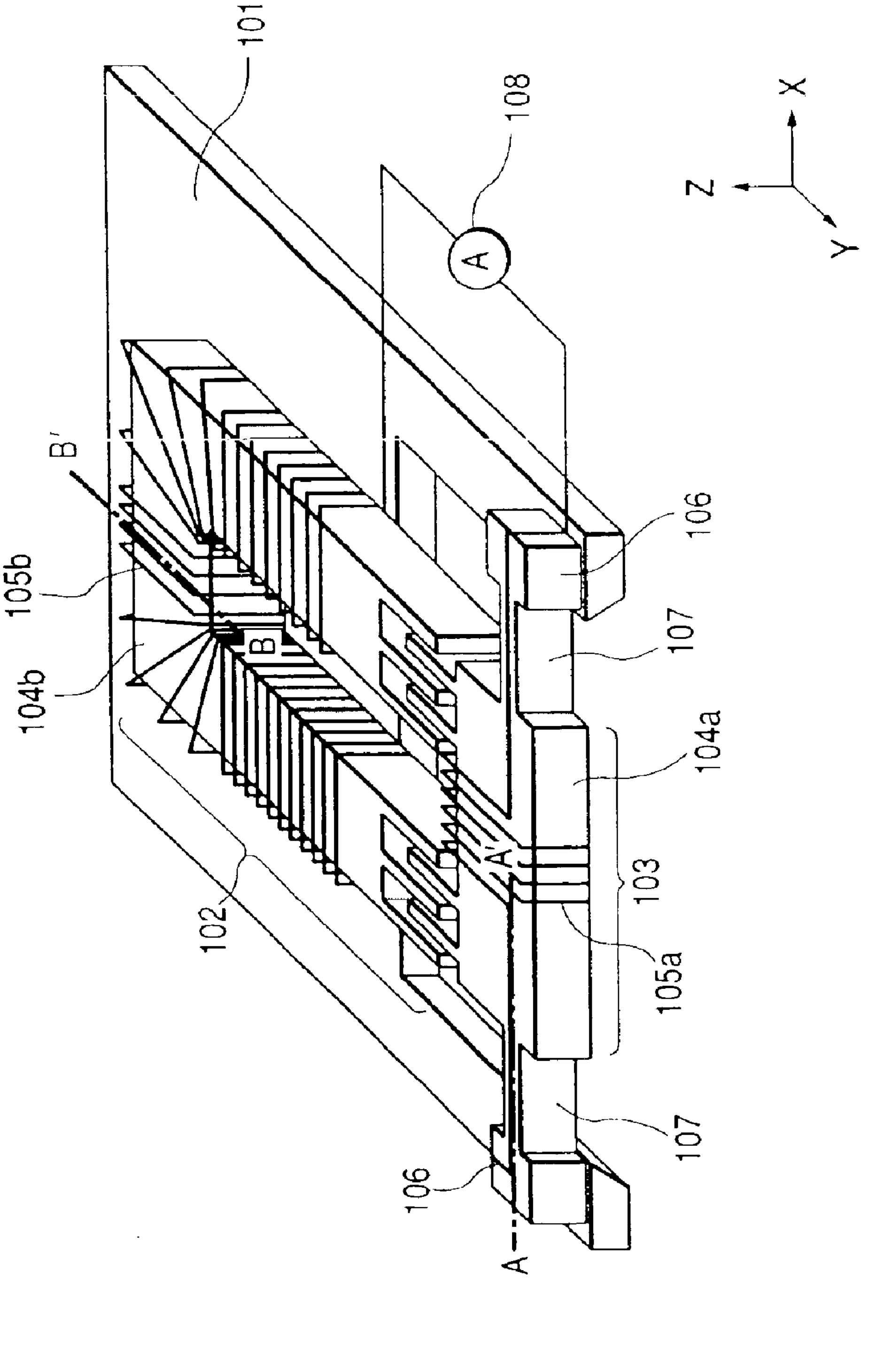
FIG. 2 is a schematic perspective view of a first embodiment of electromagnetic actuator according to the invention.

FIG. 2 is a schematic perspective view of a first embodiment of electromagnetic actuator according to the invention. Referring to FIG. 2, in the embodiment, the stationary member 102 comprises a stationary core 104*b* and a stationary coil 105*b*. A substrate 101 carries thereon the stationary member 102 and a support member 106, which are rigidly secured to the former. On the other hand, the movable member 103 comprises a movable core 104*a* held at the opposite ends thereof by parallel hinged springs 107 and a movable coil 105*a* wound around the movable core 104*a*. The parallel hinged springs 107 are held in position at the support sections 106 thereof. With this arrangement, the movable member 103 is resiliently supported in such a way that it is held in parallel with the substrate 101 and can freely move relative to the latter.

The stationary member 102 has comb-like teeth arranged at the opposite ends thereof and located in such a way that it is magnetically connected with the movable member 103 having a lateral side that is also toothed in a comb-like manner. The stationary core 104*b* and the movable core 104*a* are respectively provided with a stationary coil 105*b* and a movable coil 105*a* that are wound therearound. Referring to FIG. 2, the stationary coil 105*b*, the movable coil 105*a* and electric current source 108 are connected in series so that the operation of the actuator is controlled by the electric current source 108. As clearly seen from FIG. 2, the stationary core 104*b* and the movable core 104*a* form a closed magnetic path.

Figure 3:
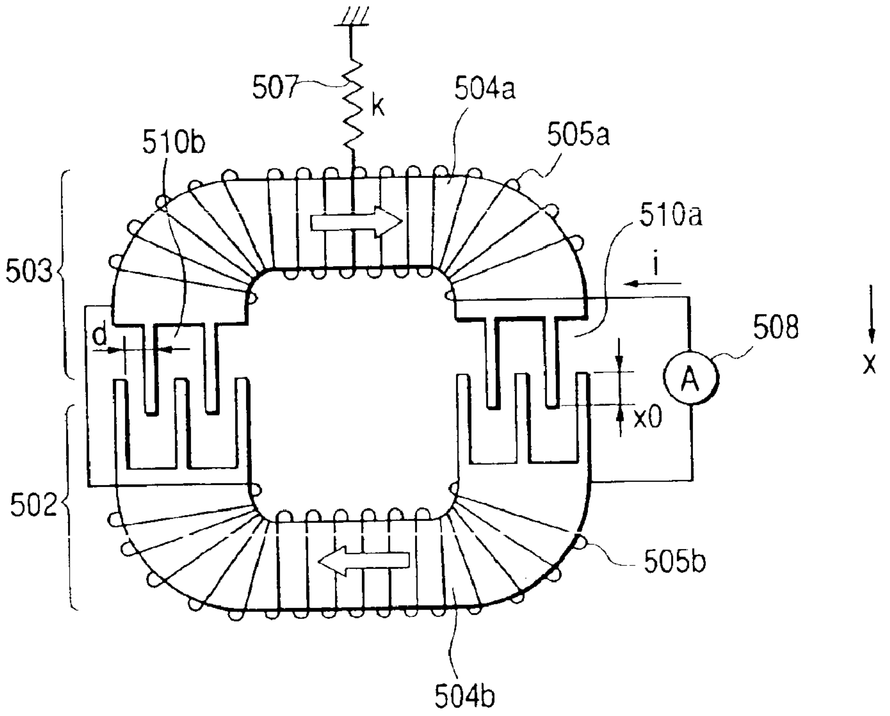
FIG. 3 is a schematic view of a second embodiment of electromagnetic actuator according to the invention, illustrating the principle underlying the operation thereof.

Now, another embodiment of electromagnetic actuator according to the invention will be described by referring to FIG. 3, which is a schematic illustration of the principle underlying the operation of the second embodiment that is a comb-shaped attraction type electromagnetic actuator. As shown in FIG. 3, both the stationary member 502 and the movable member 503 are comb-shaped at the opposite ends thereof. The stationary member 502 comprises a stationary coil 505*b* and a stationary core 504*b*, whereas the movable member 503 comprises a movable coil 505*a* and a movable core 504*a*. This embodiment is still characterised in that both the stationary member 502 and the movable member 503 are provided with a coil and a core.

The electric current source 508, the movable coil 505*a* and the stationary coil 505*b* are electrically connected with each other in series. The movable core 504*a* is resiliently supported by a spring 507 having a spring constant of k. The movable coil 505*a* and the stationary coil 505*b* are made of a low resistance metal such as copper or aluminum and electrically insulated from the movable core 504*a* and the stationary core 504*b*. The movable core 504*a* and the stationary core 504*b* are made of a ferromagnetic material such as nickel, iron or Permalloy. As the movable coil 505*a* and the stationary coil 505*b* are fed with an electric current from the electric current 508, a magnetic flux is generated in the movable core 504*a* and the stationary core 504*b* to run in the direction of arrows shown in FIG. 3. The magnetic flux circularly runs through the magnetic circuit in the direction as indicated by arrows in FIG. 3 by way of the movable core 504*a*, an air gap 510*a* between the oppositely disposed teeth of one corresponding pair of combs, the stationary core 504*b* and another air gap 510*b* between the oppositely disposed teeth of the other corresponding pair of combs to make the movable member 503 and the stationary member 502 attract each other.

The magnetic resistance $R_g(x)$ between the oppositely disposed teeth of the combs is given by formula (3) shown below:

$$R_g(x) = \frac{d}{\mu_0 tn(x + x_0)} \quad (3)$$

where $\mu_0$ is the magnetic permeability of vacuum, d is the distance of the air gap, t is the thickness of the teeth of the combs, n is the number of unit air gaps, x is the displacement of the movable member and $x_0$ is the overlapping distance of the teeth of the oppositely disposed combs in the initial state. If the magnetic resistance in areas other than the air gaps is R, the potential energy w of the entire magnetic circuit and the force F generated in the air gaps is expressed by formulas (4) and (5) respectively:

$$W = \frac{1}{2}(R + 2R_g(x))^{-1}(Ni)^2 = \frac{(Ni)^2}{2}\left(R + \frac{2d}{\mu_0 tn(x + x_0)}\right)^{-1} \quad (4)$$

and $$F = -\frac{dW}{dx} = \frac{1}{2}\left(\frac{2d}{\mu_0 tn(x + x_0)^2}\right)\left(R + \frac{2d}{\mu_0 tn(x + x_0)}\right)^{-2}(Ni)^2 \quad (5)$$

where N is the sum of the number of turns of the coil 505*a* and that of the coil 505*b* and i is the electric current flowing through the coils 505*a* and 505*b*.

If the movable core 504*a* and the stationary core 504*b* are made of a material showing a magnetic permeability sufficiently higher than the magnetic permeability of vacuum, R is made practically equal to 0 and the generated force F is expressed by formula (6) below.

$$F = \frac{\mu_0 tn}{4d}(Ni)^2 \quad (6)$$

From formula (6) above, it will be seen that the generated force F of this embodiment is proportional to the square of the number of turns of the coils. While the generated force F fluctuates slightly depending on the displacement x because the magnetic permeability cannot be infinitely high, such fluctuations in the generated force are small if compared with conventional magnetic actuators.

If the spring constant of the parallel hinged springs is k, the static displacement of the actuator is obtained from the balanced relationship of the spring force and the generated force as expressed by formula (7) below.

$$F = kx \quad (7)$$

A comb-shaped repulsion type electromagnetic actuator can be realized by modifying the direction of winding of the movable coil 505*a* or the stationary coil 505*b* of the comb-shaped attraction type electromagnetic actuator.

Figure 4:
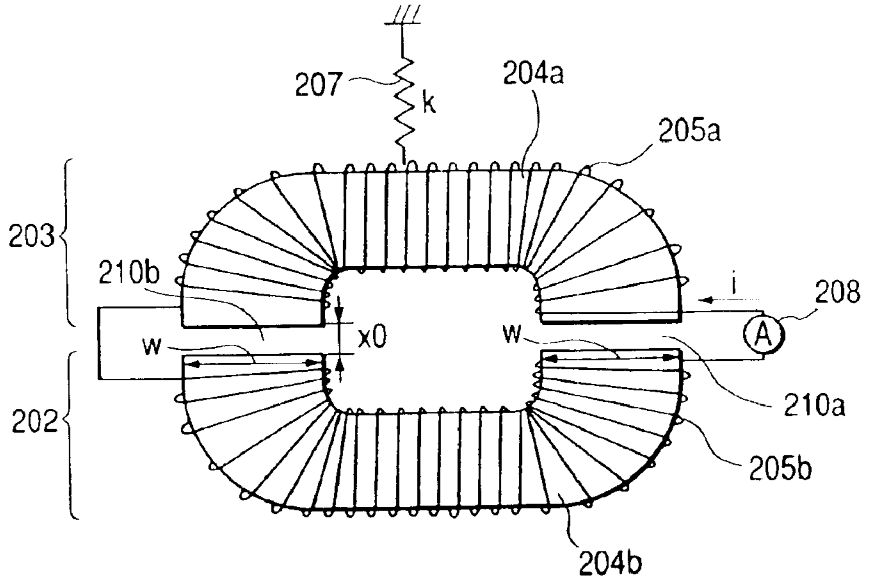
FIG. 4 is a schematic view of a third embodiment of electromagnetic actuator according to the invention, illustrating the principle underlying the operation thereof.

Now, still another embodiment of electromagnetic actuator according to the invention will be described by referring to FIG. 4, which is a schematic illustration of the principle underlying the operation of the third embodiment that is a flat surface attraction type electromagnetic actuator. As shown in FIG. 4, both the stationary member 202 and the movable member 203 have flat surfaces at the opposite ends thereof. The stationary member 202 comprises a stationary coil 205*b* and a stationary core 204*b*, whereas the movable member 203 comprises a movable coil 205*a* and a movable core 204*a*. This embodiment is still characterised in that both the stationary member 202 and the movable member 203 are provided with a coil and a core.

The electric current source 208, the movable coil 205*a* and the stationary coil 205*b* are electrically connected with each other in series. The movable core 204*a* is resiliently supported by a spring 207 having a spring constant of k. The movable coil 205*a* and the stationary coil 205*b* are made of a low resistance metal such as copper or aluminum and electrically insulated from the movable core 204*a* and the stationary core 204*b*. The movable core 204*a* and the stationary core 204*b* are made of a Ferromagnetic material such as nickel, iron or Permalloy.

As the movable coil 205*a* and the stationary coil 205*b* are fed with an electric current from the electric current source 208, a magnetic flux is generated in the movable core 204*a* and the stationary core 204*b* to run in the direction of arrows shown in FIG. 4. The magnetic flux circularly runs through the magnetic circuit in the direction as indicated by arrows in FIG. 4 by way of the movable core 204*a*, an air gap 210*a* between the oppositely disposed surfaces of one corresponding ends, the stationary core 204*b* and another air gap 210*b* between the oppositely disposed surfaces of the other corresponding ends to make the movable member 203 and the stationary member 202 attract each other.

The magnetic resistance of one air gap between the oppositely disposed surfaces is given by formula $(x+x_0)/\mu_0 tw$ and since a magnetic path transverses two air gaps, the magnetic resistance Rg(x) of the two air gaps separating the plates is given by formula (8) below:

$$R_g(x) = \frac{2(x + x_0)}{\mu_0 tw} \quad (8)$$

where $\mu_0$ is the magnetic permeability of vacuum, t is the thickness of the end surface sections, w is the width of the end surface sections, x is the displacement of the movable member and $x_0$ is the length of the air gaps in the initial state. If the magnetic resistance in areas other than the air gaps is R, the potential energy w of the entire magnetic circuit and the force F generated in the air gaps is expressed by formulas (9) and (10) respectively:

$$W = \frac{1}{2}(R + R_g(x))^{-1}(Ni)^2 = \frac{(Ni)^2}{2}\left(R + \frac{2(x + x_0)}{\mu_0 tw}\right)^{-1} \quad (9)$$

and $$F = -\frac{dW}{dx} = \frac{1}{\mu_0 tw}\left(R + \frac{2(x + x_0)}{\mu_0 tw}\right)^{-2}(Ni)^2 \quad (10)$$

where N is the sum of the number of turns of the coil 205*a* and that of the coil 205*b* and i is the electric current flowing through the coils 205*a* and 205*b*.

If the movable core 204*a* and the stationary core 204*b* are made of a material showing a magnetic permeability sufficiently higher than the magnetic permeability of vacuum, R is made practically equal to 0 and the generated force F is expressed by formula (11) below.

$$F = \frac{\mu_0 tw}{4(x + x_0)^2}(Ni)^2 \quad (11)$$

From formula (11) above, it will be seen that the generated force F of this embodiment is proportional to the square of the number of turns of the coils.

If the spring constant of the parallel hinged springs is k, the static displacement of the actuator is obtained from the balanced relationship of the spring force and the generated force as expressed by formula (12) below.

$$F=kx \tag{12}$$

A flat surface repulsion type electromagnetic actuator can be realized by modifying the direction of winding of the movable coil 205*a* or the stationary coil 205*b* of the flat surface attraction type electromagnetic actuator.

The present invention will be described further below by way of examples.

EXAMPLE 1

An electromagnetic actuator having a configuration as shown in FIG. 2 was prepared. Referring to FIG. 2, stationary member 102 comprises a stationary core 104*b* and a stationary coil 105*b*. A substrate 101 carries thereon the stationary member 102 and a support member 106, which are rigidly secured to the former. On the other hand, movable member 103 comprises a movable core 104*a* held at the opposite ends thereof by parallel hinged springs 107 and a movable coil 105*a* wound around the movable core 104*a*. The parallel hinged springs 107 are held in position at the support sections 106 thereof. With this arrangement, the movable member 103 is resiliently supported in such a way that it is held in parallel with the substrate 101 and can freely move relative to the latter.

The stationary member 102 has comb-like teeth arranged at opposite ends thereof and located in such a way that it is magnetically connected with the movable member 103 having a lateral side that is also toothed in a comb-like manner. The stationary core 104*b* and the movable core 104*a* are provided respectively with a stationary coil 105*b* and a movable coil 105*a* that are wound therearound. The stationary coil 105*b*, the movable coil 105*a* and electric current source 108 are connected in series so that the operation of the actuator is controlled by the electric current source 108.

Now, a method used for preparing the actuator of this example will be described below. In this example, the stationary member 102, the movable member 103, the movable core 104*a*, the stationary core 104*b*, the movable coil 105*a*, the stationary coil 105*b*, the movable coil 105*a*, the support member 106 and the parallel hinged springs 107 are prepared by means of micromachining technology. Coil lower surface wiring 114, coil lateral surface wiring 115 and coil upper surface wiring 116 are prepared in the above mentioned order for both the movable coil 105*a* and the stationary coil 105*b* (see FIG. 5L).

Now, the method used for preparing the actuator of this example will be described in greater detail by referring to FIGS. 5A through 5L. In each of FIGS. 5A through 5L, the left side and the right side show cross sectional views taken along line A–A' and B–B' in FIG. 2 respectively.

Figure 5A:
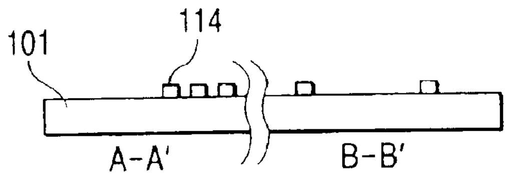
FIGS. 5A, 5B, 5C, 5D, 5E, 5F, 5G, 5H, 5I, 5J, 5K and 5L are schematic cross sectional views of an electromagnetic actuator according to the invention as shown in different preparing steps, illustrating the method of preparing it.
Figure 5B:
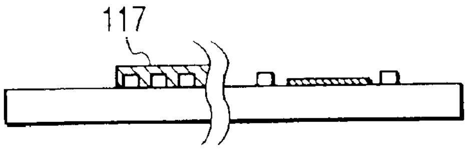
Figure 5C:
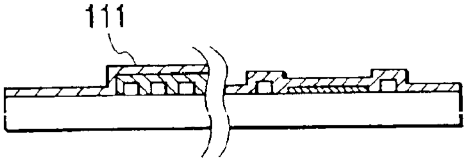

Firstly as shown in FIG. 5A, a copper film was formed as coil lower surface wiring 114 on a substrate 101 by evaporation and subjected to a patterning operation. Subsequently, as shown in FIG. 5B, polyimide was applied to the substrate 101 to form an insulating layer 117 between the coil lower surface wiring 114 and the cores to be formed subsequently and subjected to a patterning operation. Then, as shown in FIG. 5C, chromium was deposited as seed electrode layer 111 for electric plating by evaporation and then gold was deposited thereon also by evaporation.

Figure 5D:
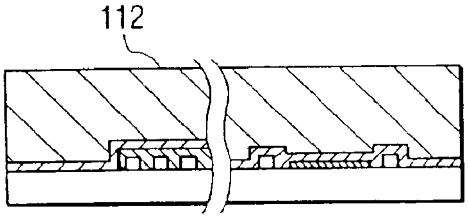
Figure 5E:
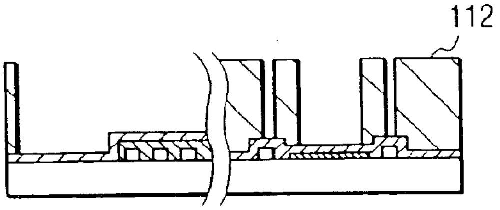
Figure 5F:
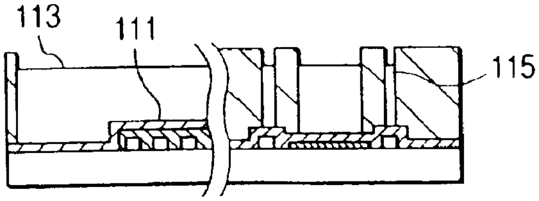

Thereafter, as shown in FIG. 5D, photoresist was applied to form a photoresist layer 112 that is 300 $\mu$m thick. In this example, SU-8 (tradename, available from Micro Chem) was used as photoresist because it is adapted to be applied to a large thickness. Then, as shown in FIG. 5E, the photoresist layer 112 was exposed to light, developed and subjected to a patterning operation. The parts of the photoresist removed in this process provides female moulds for the stationary member 102, the movable member 103, the movable core 104*a*, the stationary core 104*b*, the support member 106, the parallel hinged springs 107 and the coil lateral surface wiring 115. Subsequently, as shown in FIG. 5F, Permalloy layers 113, 115 were electrically plated by applying a voltage to the seed electrode layer 111.

Figure 5G:
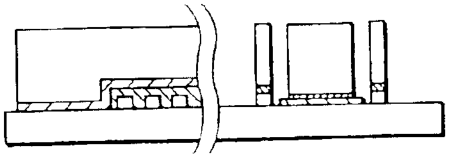
Figure 5H:
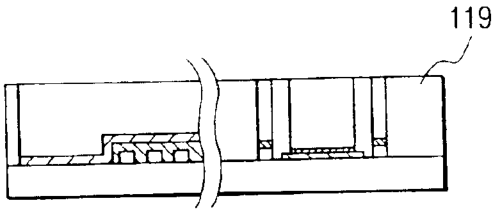
Figure 5I:
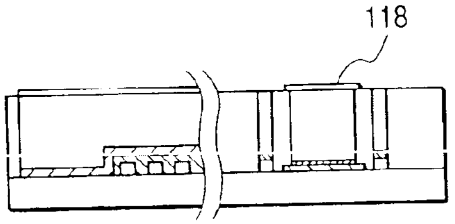
Figure 5J:
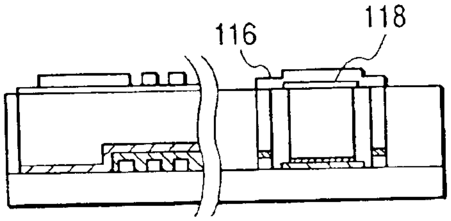
Figure 5K:
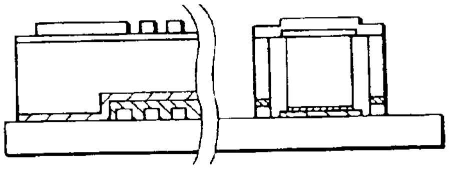

Thereafter, as shown in FIG. 5G, the photoresist layer and the underlying seed electrode layer were removed by dry etching. Then, as shown in FIG. 5H, epoxy resin 119 was applied and the upper surface of the epoxy resin layer was smoothed by polishing it mechanically. Subsequently, as shown in FIG. 5I, polyimide was applied to the upper surface of the epoxy resin layer 119 in parts that eventually make a movable core and a stationary core to form an insulating layer 118 there, which was then subjected to a patterning operation. Thereafter, as shown in FIG. 5J, copper was deposited on the insulating layer 118 between the upper surface wiring 116 and the cores by evaporation and then subjected to a patterning operation. Then, the epoxy resin was removed as shown in FIG. 5K.

Figure 5L:
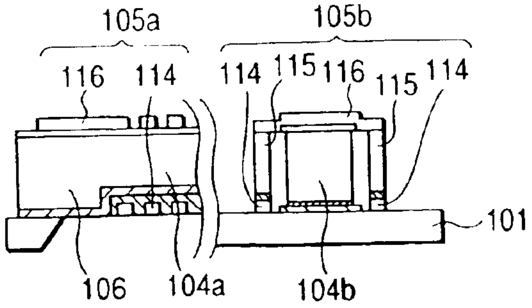

Finally, as shown in FIG. 5L, the substrate 101 was anisotropically etched from the rear surface thereof so that the movable member is supported only by the support member 106. In FIG. 5L, the components same as those illustrated in FIGS. 2 and 5A through 5K are denoted respectively by the same reference symbols and will not be described any further.

Since the electromagnetic actuator of this example that was prepared in a manner as described above showed an excellent energy efficiency because a single troidal coil was formed by the movable member and the stationary member to minimize the leakage of magnetic flux. Additionally, since the movable member and the stationary member comprise respective coils and cores, the number of turns of the coils can be raised to increase the force generated in the actuator.

EXAMPLE 2

Figure 6:
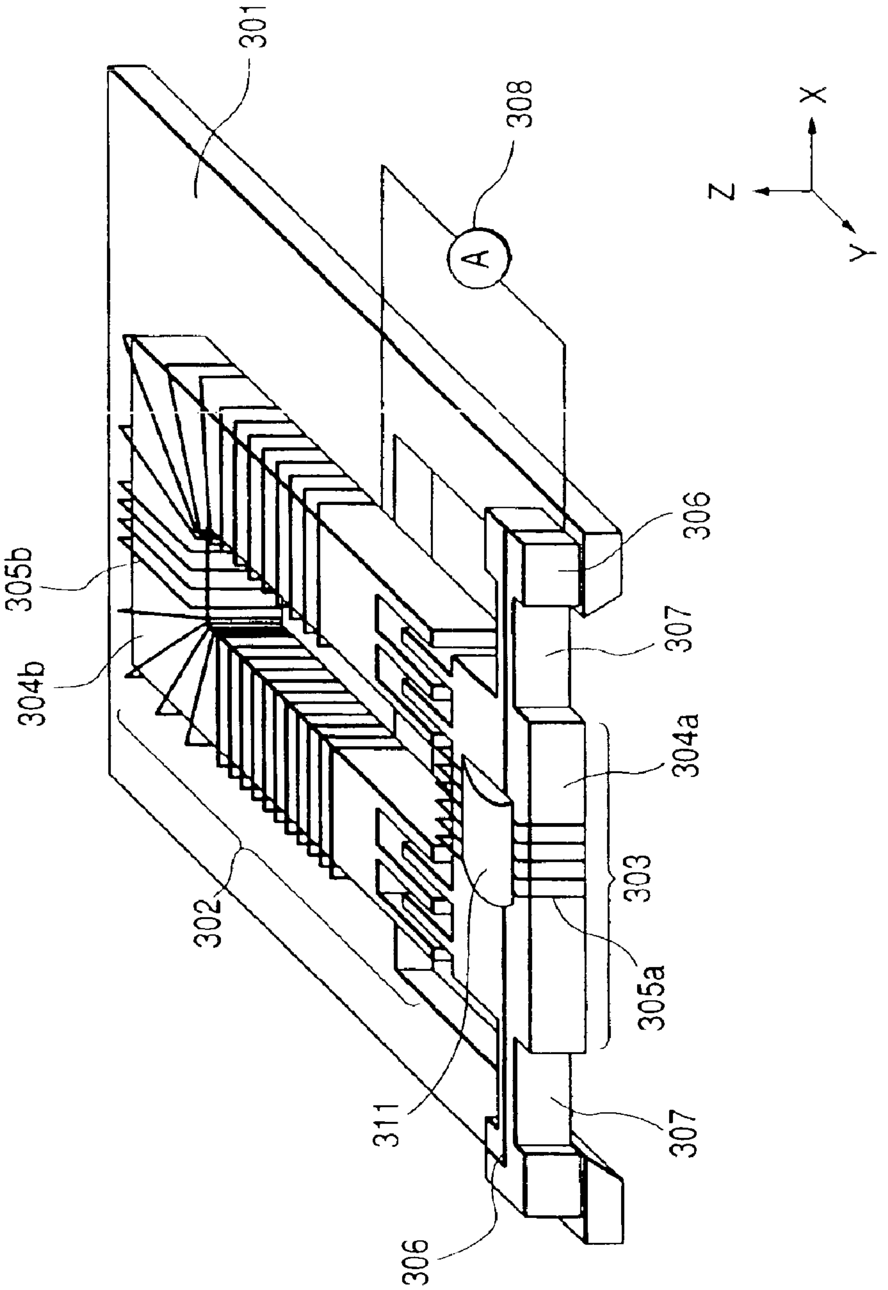
FIG. 6 is a schematic perspective view of the electromagnetic actuator used for the reflection type optical scanner in Example 2.

FIG. 6 is a schematic perspective view of the electromagnetic actuator used for a reflection type optical scanner in Example 2. Referring to FIG. 6, stationary member 302 comprises a stationary core 304*b* and a stationary coil 305*b*. A substrate 301 carries thereon the stationary member 302 and a support member 306, which are rigidly secured to the former. On the other hand, movable member 303 comprises a movable core 304*a* held at the opposite ends thereof by parallel hinged springs 307 and a movable coil 305*a* wound around the movable core 304*a*. The parallel hinged springs 307 are held in position at the support sections 306 thereof. With this arrangement, the movable member 303 is resiliently supported in such a way that it is held in parallel with the substrate 301 and can freely move relative to the latter.

Mirror 311 is arranged on the movable member 303. The stationary member 302 has comb-like teeth arranged at the opposite ends thereof and located in such a way that it is magnetically connected with the movable member 303 having a lateral side that is also toothed in a comb-like manner. The stationary core 304*b* and the movable core 304*a* are provided respectively with a stationary coil 305*b* and a movable coil 305*a* that are wound therearound. The stationary coil 305*b*, the movable coil 305*a* and electric current source 308 are connected in series so that the operation of the actuator is controlled by the electric current source 308. The stationary member 302 and the movable member 303 are provided with teeth projecting like those of combs that are interdigitally arranged. This arrangement could be prepared by way of a process similar to the one described above by referring to Example 1.

Figure 7A:
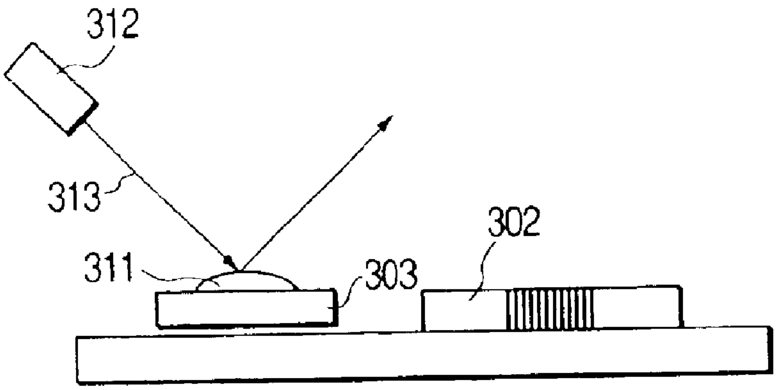
FIGS. 7A and 7B are schematic views of the reflection type optical scanner of Example 2, illustrating the principle underlying the operation thereof.
Figure 7B:
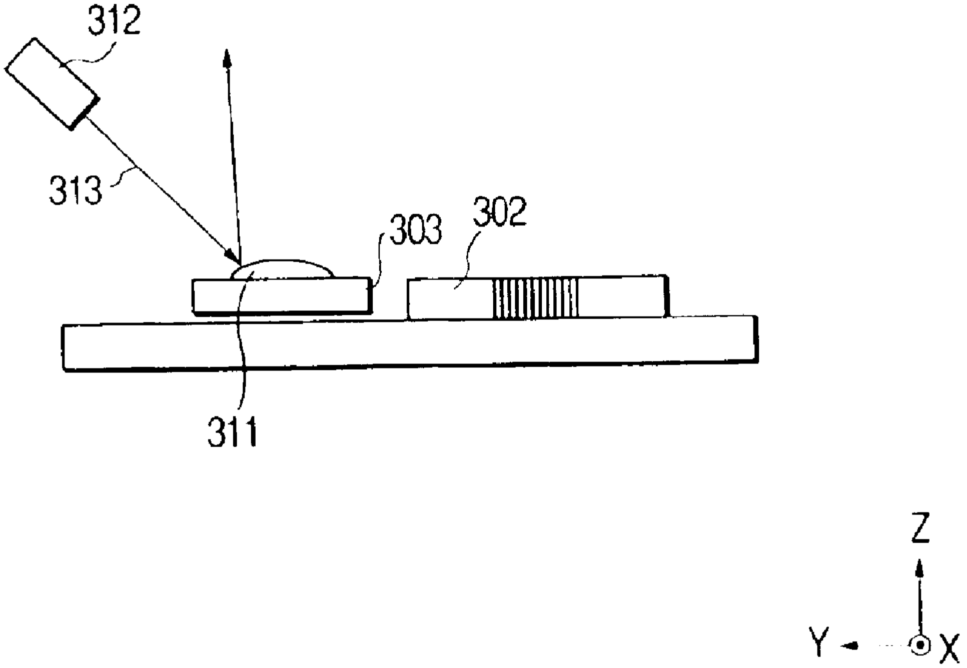

FIGS. 7A and 7B are schematic views of the reflection type optical scanner of Example 2, illustrating the principle underlying the operation thereof. Referring to FIGS. 7A and 7B, reference symbols 312 and 313 respectively denote a semiconductor laser and a laser beam. The semiconductor laser 312 is arranged in such a way that the laser beam 313 strikes the mirror 311. The semiconductor laser 312 may be located on the substrate 301 shown in FIG. 6 or at some other position. As the movable coil 305*a* and the stationary coil 305*b* are electrically energized, the movable member 303 and the stationary member 302 attract each other. FIG. 7A shows the state where the movable coil 305*a* and the stationary coil 305*b* in FIG. 6 are not electrically energized, whereas FIG. 7B shows the state where the movable coil 305*a* and the stationary coil 305*b* in FIG. 6 are electrically energized. As seen from FIGS. 7A and 7B, the direction of the laser beam 313 is modified as the movable coil 305*a* and the stationary coil 305*b* are electrically energized. The electromagnetic actuator used in the optical scanner of this example showed an excellent energy efficiency because the leakage of magnetic flux is minimized if compared with conventional electromagnetic actuators. Additionally, since the movable member and the stationary members comprise respective coils and cores, the number of turns of the coils can be raised to increase the force generated in the actuator. Thus, a reflection type optical scanner that shows an excellent energy efficiency and a large deflector angle can be prepared by micromachining, using an electromagnetic actuator like the one prepared in this example.

EXAMPLE 3

Figure 8:
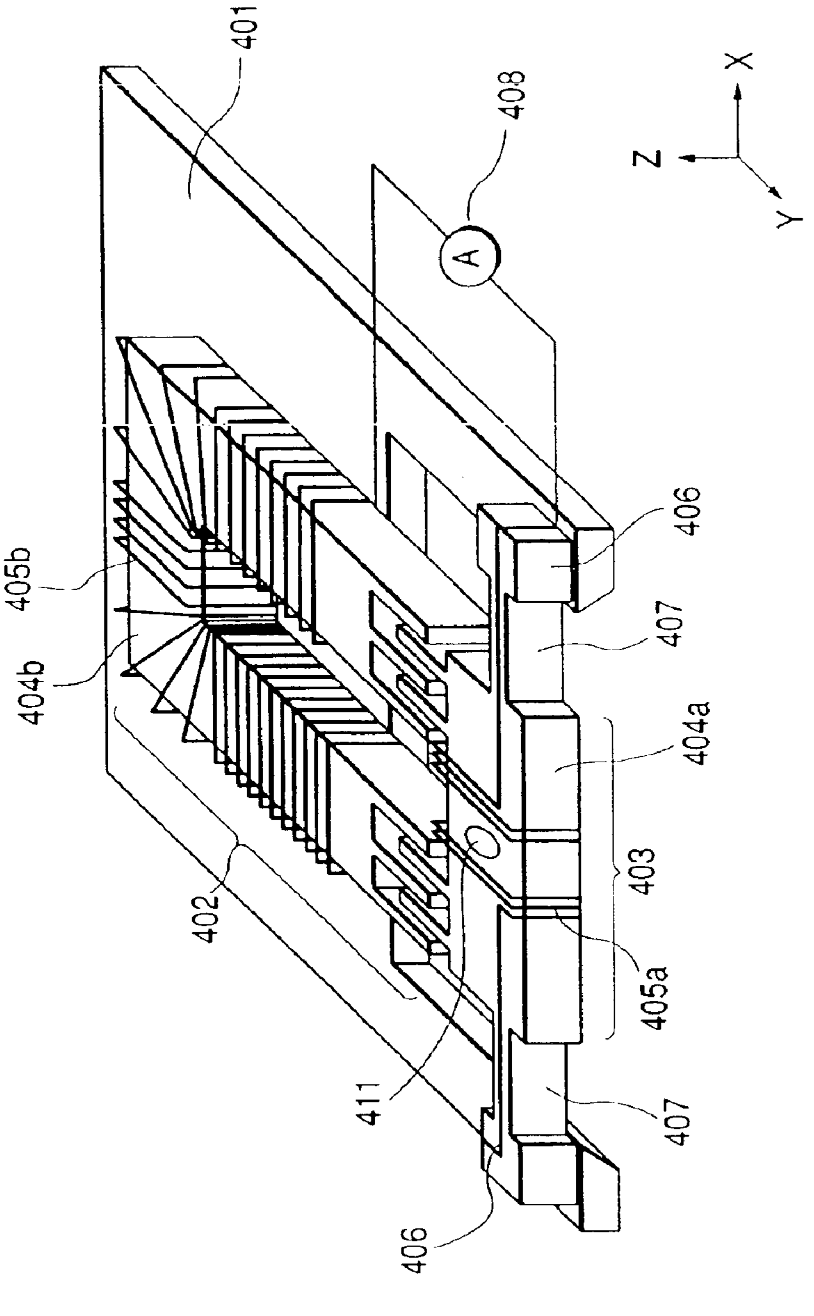
FIG. 8 is a schematic perspective view of the electromagnetic actuator used for the transmission type optical scanner in Example 3.

FIG. 8 is a schematic perspective view of the electromagnetic actuator used for a transmission type optical scanner in Example 3. Referring to FIG. 8, stationary member 402 comprises a stationary core 404*b* and a stationary coil 405*b*. A substrate 401 carries thereon the stationary member 402 and a support member 406, which are rigidly secured to the former. On the other hand, movable member 403 comprises a movable core 404*a* held at the opposite ends thereof by parallel hinged springs 407 and a movable coil 405*a* wound around the movable core 404*a*. The parallel hinged springs 407 are held in position at the support sections 406 thereof. With this arrangement, the movable member 403 is resiliently supported in such a way that it is held in parallel with the substrate 401 and can freely move relative to the latter.

Lens 411 is arranged on the movable member 403 to transmit laser beams. The stationary member 402 has comb-like teeth arranged at the opposite ends thereof and located in such a way that it is magnetically connected with the movable member 403 having a lateral side that is also toothed in a comb-like manner. The stationary core 404*b* and the movable core 404*a* are provided respectively with a stationary coil 405*b* and *a* movable coil 405*a* that are wound therearound. The stationary coil 405*b*, the movable coil 405*a* and electric current source 408 are connected in series so that the operation of the actuator is controlled by the electric current source 408. The stationary member 402 and the movable member 403 are provided with teeth projecting like those of combs that are interdigitally arranged. This arrangement can be prepared by way of a process similar to the one described above by referring to Example 1.

Figure 9A:
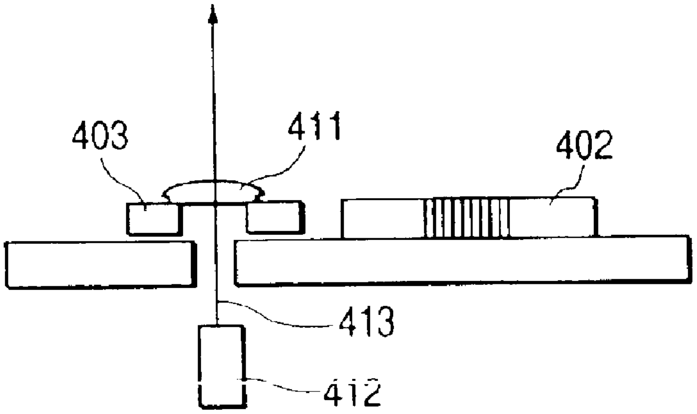
FIGS. 9A and 9B are schematic views of the transmission type optical scanner of Example 3, illustrating the principle underlying the operation thereof.
Figure 9B:
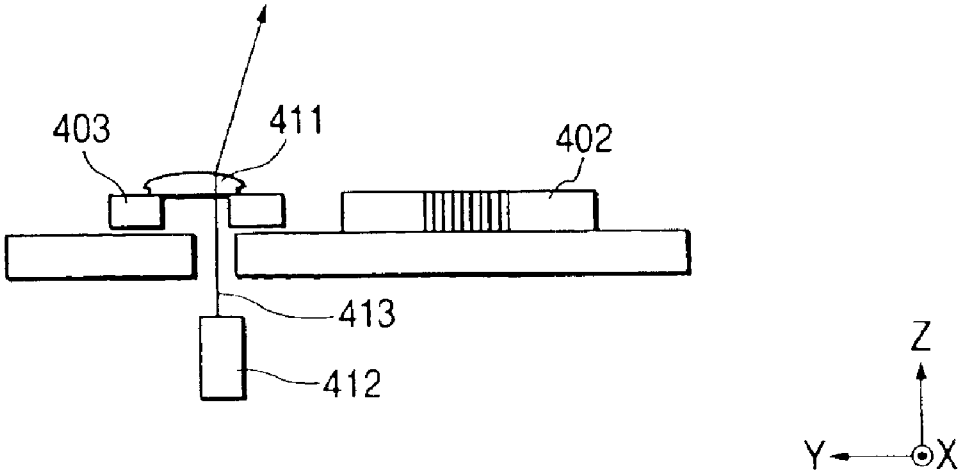

FIGS. 9A and 9B are schematic views of the transmission type optical scanner of Example 3, illustrating the principle underlying the operation thereof. Referring to FIGS. 9A and 9B, reference symbols 412 and 413, respectively, respective denote a semiconductor laser and a laser beam. The semiconductor laser 412 is arranged in such a way that the laser beam 413 is transmitted through the lens 411. The semiconductor laser 412 may be located on the substrate 401 shown in FIG. 8 or at some other position. As the movable coil 405*a* and the stationary coil 405*b* are electrically energized, the movable member 403 and the stationary member 402 are repulsed from each other. FIG. 9A shows the state where the movable coil 405*a* and the stationary coil 405*b* in FIG. 8 are not electrically energized, whereas FIG. 9B shows the state where the movable coil 405*a* and the stationary coil 405*b* in FIG. 8 are electrically energized. As seen from FIGS. 9A and 9B, the direction of the laser beam 413 is modified as the movable coil 405*a* and the stationary coil 405*b* are electrically energized. Thus, a transmission type optical scanner that shows an excellent energy efficiency and a large deflector angle can be prepared by micromachining, using an electromagnetic actuator like the one prepared in this example.

As described above in detail, an electromagnetic actuator according to the invention can be operated at a low power consumption rate to improve the energy efficiency if compared with conventional electromagnetic actuators because of a minimized leakage of magnetic flux. Additionally, since both the stationary member and the movable member of an electromagnetic actuator according to the invention are provided with respective coils and cores, the total number of turns of the cores can be increased to raise the force generated in the electromagnetic actuator.

Furthermore, according to the invention, a reflection type optical scanner showing a large deflection angle and a high energy efficiency and comprising a mirror and an electromagnetic actuator mechanically connected to the mirror can be prepared by micro-machining.

Similarly, according to the invention, a transmission type optical scanner showing a large deflection angle and a high energy efficiency and comprising a lens and an electromagnetic actuator mechanically connected to the lens can be prepared by micromachining.

What is claimed is:

1. A method of preparing an electromagnetic actuator comprising a stationary member having a first core section carrying a first coil wound around the periphery of the first core section, a movable member magnetically coupled with said stationary member with a gap therebetween and having a second core section carrying a second coil wound around the periphery of the second core section, and a support member for displaceably supporting said movable member relative to said stationary member, said method comprising steps of:

forming said stationary member, said movable member and said support member on a single silicon substrate by means of photolithography and plating; and removing the silicon substrate from under the movable member so as to make the movable member to be supported by the silicon substrate by way of the support member, wherein said step of removing the silicon substrate is a step of anisotropically etching the silicon substrate from the rear surface thereof.

* * * * *

UNITED STATES PATENT AND TRADEMARK OFFICE

CERTIFICATE OF CORRECTION

PATENT NO. : 6,920,681 B2 
DATED : July 26, 2005
INVENTOR(S) : Futoshi Hirose et al.

It is certified that error appears in the above-identified patent and that said Letters Patent is hereby corrected as shown below:

<u>Column 2,</u>
Line 47, “invention;” should read -- invention. --.
Lines 50 and 53, “thereof;” should read -- thereof. --.

<u>Column 4,</u>
Line 39, “characterised” should read -- characterized --.

<u>Column 5,</u>
Line 65, “characterised” should read -- characterized --.

<u>Column 10,</u>
Line 4, “respectively, respective” should read -- respectively --.

Signed and Sealed this

Thirteenth Day of June, 2006

JON W. DUDAS
*Director of the United States Patent and Trademark Office*